United States Patent [19]
Ford et al.

[11] Patent Number: 5,319,727
[45] Date of Patent: Jun. 7, 1994

[54] ION-BEAM DEPOSITED, GAIN ENHANCED RING RESONATORS

[75] Inventors: Carol M. Ford, Columbia Heights; Theodore J. Podgorski, St. Paul, both of Minn.

[73] Assignee: Honeywell Inc., Minneapolis, Minn.

[21] Appl. No.: 997,405

[22] Filed: Dec. 28, 1992

[51] Int. Cl.[5] .............................. G02B 6/10
[52] U.S. Cl. ............................ 385/30; 385/131; 385/141; 372/94
[58] Field of Search ............... 372/94, 64; 333/208; 356/350; 385/30, 14, 130, 131, 129, 141, 142, 143, 144, 145

[56] References Cited

U.S. PATENT DOCUMENTS

| | | | |
|---|---|---|---|
| 4,097,826 | 6/1978 | Knox et al. | 333/208 |
| 4,792,962 | 12/1988 | Miyauchi et al. | 372/94 |
| 5,123,027 | 6/1992 | Lawrence | 356/350 |
| 5,194,079 | 3/1993 | Tumminelli et al. | 385/131 |

FOREIGN PATENT DOCUMENTS 2227359  12/1989  United Kingdom .

OTHER PUBLICATIONS

"Extended-Cavity Operation of Rare-Earth-Doped Glass Waveguide Lasers", Sanford et al., National Institute of Standards and Technology, Optic Letters, vol. 16, No. 14, Jul. 15, 1991.

"Lightwave Communications:The Fifth Generation", Emmanuel Desurvire, Scientific America, Jan. 1992.

Primary Examiner—Rodney B. Bovernick
Assistant Examiner—John Ngo
Attorney, Agent, or Firm—Craig J. Lervick

[57] ABSTRACT

An optical waveguide is created using the process of ion beam deposition resulting in a waveguide with low propagation loss, mode discrimination, and gain characteristics. The waveguide is made up of a multilayer stack which is deposited upon a thermally stable substrate, wherein the multilayer stack comprises alternating layers of a first material and a second material. The layers of second material are doped with a rare earth material. By pumping the waveguide with a pump light source, interaction between the pump light and the rare earth material within the waveguide causes amplification or gain of a first optical signal. Ion beam deposition is used to fabricate the waveguide, therefore production of a high quality rare earth doped waveguide is possible. Furthermore, the waveguide is made using batch processing thus reducing costs.

7 Claims, 2 Drawing Sheets

ION-BEAM DEPOSITED, GAIN ENHANCED RING RESONATORS

BACKGROUND OF THE INVENTION

The present invention relates to optical waveguides for carrying optical signals, or causing optical signals to resonate. More specifically, the invention relates to solid state optical waveguides which provide gain or amplification to the optical signals being carried there through.

Typically an optical waveguide is comprised of a thin film of material deposited upon a substrate. This material is then etched or altered to form a waveguide path.

Optical waveguides are becoming increasingly popular, specifically in the fields of communications optical circuits and resonators. Furthermore, optical waveguides may be used for any application which requires the transmission of optical signals from one point to another.

Optical waveguides may be easily configured to form resonators. Resonators can be created by configuring the optical waveguide in a closed loop path and injecting or coupling light beams therein. Due to the closed loop configuration of the waveguide path, the light within the path is caused to resonate within the closed loop. These closed loop resonators are useful for rotation sensing in passive cavity gyroscopes.

Propagation loss within the waveguide is a very important parameter which will effect efficiency and operation. Generally, optical waveguides are very low loss devices However, it is desired to create a lower loss, more ideal optical waveguide. While many waveguides are presently very low loss devices, propagation loss is still a problem for many applications, including long haul transmission and closed loop resonators. Due to propagation losses there is a need to provide amplifiers or boosters which will increase the amplitude of the signals to account for propagation losses within the waveguide.

Much work is being done in the field of signal transmission to provide amplifiers within a waveguide transmission system. These amplifiers are especially important when transmitting signals over large distances.

As previously mentioned, in the field of rotation sensing a resonator can be used to detect rotation. In a closed loop resonator, light beams travel around the closed loop. If this loop is rotated, the frequency of the resonant signals are shifted. However, in order to create a rotation sensor using these principles, it is necessary to have a very low loss resonator with amplification capabilities, thus allowing the resonant light to maintain itself for long periods of time.

In the fields of communication signal transmission and rotation sensing, work is presently being done with fiber optic cables Again, fiber optic cables experience problems due to propagation loss and thus reduce their efficiency and effectiveness for carrying signals over long large distances. Therefore, work is presently being done to provide fiber optic cables with periodic amplifiers to amplify the signals being transmitted there through. One attempted method of providing amplification has been to dope the fiber optic cable with rare earth materials and optically pump these materials to create population inversion which can amplify light. The rare earth materials used include erbium, neodymium, and praseodymium. Many problems have been encountered with this technique however, causing the desired amplification to be ineffective. One big problem involves the clumping of material within the glass fiber when doped. The doped material clumps together rather than uniformly distributing itself within the glass fiber. This clumping causes the propagation loss to increase.

With optical waveguides the method used to fabricate the waveguide is very important. Impurities within the guide will increase the propagation losses. Therefore it is necessary to create waveguides which are free of impurities. Furthermore, irregularities in the waveguide will also increase propagation loss. Maintaining a uniform thickness is therefore very important. The process used to fabricate the waveguide must be capable of controlling both thickness and purity of the resulting waveguide. Also, when doping one material with a dopant, it is important that the process used be capable of performing this doping to result in uniform, dense distribution of the dopant.

An effective method of amplifying signals within optical waveguides has not yet been developed. Therefore, at the present time it is not possible to produce an efficient low loss waveguide that has amplifying characteristics.

SUMMARY OF THE INVENTION

It is an object of the present invention to create an optical waveguide that has amplifying or gain characteristics. It is a further object of the present invention to create a ring resonator with low losses and gain characteristics that can be used in a passive cavity resonator will allow optical signals to propagate within the resonator for an indefinite period of time, as well as sharpening the resonances. Sharper resonance will allow for more sensitive rotation sensing when used in rotation sensing devices.

The above mentioned objects are achieved by creating a multilayer waveguide having low propagation loss. Such a waveguide is constructed of alternating layers of a first and a second material. The first material has a relatively high index of refraction and the second material has a relatively low index of refraction. Amplification is obtained by doping the low index of refraction material with a rare earth material.

The method used to fabricate the waveguides of the present invention can greatly effect the efficiency of the waveguide. The multilayer waveguides of the present invention are made using the process of ion beam deposition, resulting in high quality, low loss waveguides. Furthermore, this process produces layers of material that are evenly doped with a second material, thus avoiding the problems of dopant clumping.

A resonator with the above mentioned objectives is created by configuring the waveguide in a closed loop path. A first optical signal is input to the closed loop, causing this signal to resonate. Gain is added to the resonator by pumping the resonator with an appropriate second optical signal or pump signal. The rare earth material which is distributed in the lower index of refraction material provides gain for the resonator. When the pump signal interacts with the rare earth materials the rare earth materials emit photons that add to the first optical signal, thus amplifying the first optical signal. Such a resonator with gain enhancement provides a resonator in which the first optical signal will resonate without substantially degrading.

BRIEF DESCRIPTION OF THE DRAWINGS

Further objects and advantages of the present invention will become apparent after reading the following detailed description of the invention in conjunction with the attached drawings in which.

DETAILED DESCRIPTION OF THE INVENTION

Figure 1:
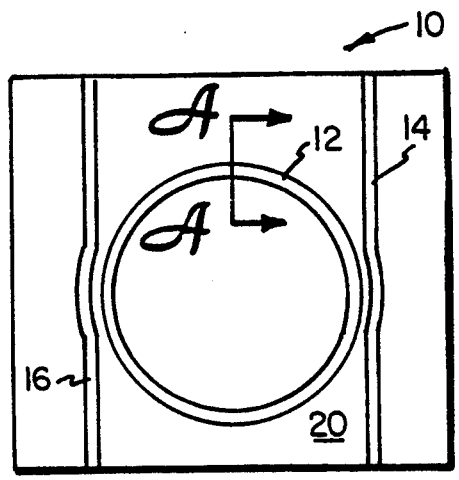
FIG. 1 is a top view of the resonator of the present invention.

Referring now to FIG. 1 there is shown a ring resonator 10 in accordance with the present invention. Ring resonator 10 is made up of a waveguide configured in a circular shape 12. On two sides of the circular waveguide 12 are a first optical coupler 14 and a second optical coupler 16. First optical coupler 14 is used to introduce a first optical signal into ring resonator 10. The first optical signal is provided to first optical coupler 14 by a laser diode (not shown) or an equivalent light source. The first optical signal is carried through first coupler 14 which is situated adjacent to circular waveguide 12. As is well known to those skilled in the art, light is caused to couple into circular waveguide 12 from first optical coupler 14. In the preferred embodiment of the invention, the first optical signal is simply light at a first wavelength.

Since circular waveguide 12 is a closed loop path the first optical signal, which is coupled into this waveguide, is caused to resonate within circular waveguide 12. The first wavelength of first optical signal may need to be adjusted to cause a first optical signal to resonate within waveguide 12.

A second optical signal is carried by second optical coupler 16 to a point that is adjacent circular waveguide 12. The second optical signal is a light beam of a different wavelength than the first optical signal. The second optical signal is coupled into circular waveguide 12 by second coupler 16. Since the second optical signal is of a different frequency than the first optical signal which is already resonating within waveguide 12, second optical signal does not interfere with first optical signal. However, amplification is caused by the coupling of second optical signal from second coupler 16. The amplification characteristics of the resonator will be elaborated upon further in the present specification.

All of the waveguides including first optical coupler 14, second optical coupler 16, and circular waveguide 12 are arranged on a single substrate 20. Substrate 20 is generally constructed of a thermally stable material in a planar configuration. It is to be understood that many different materials could be used for the substrate depending upon desired characteristics.

Figure 2:
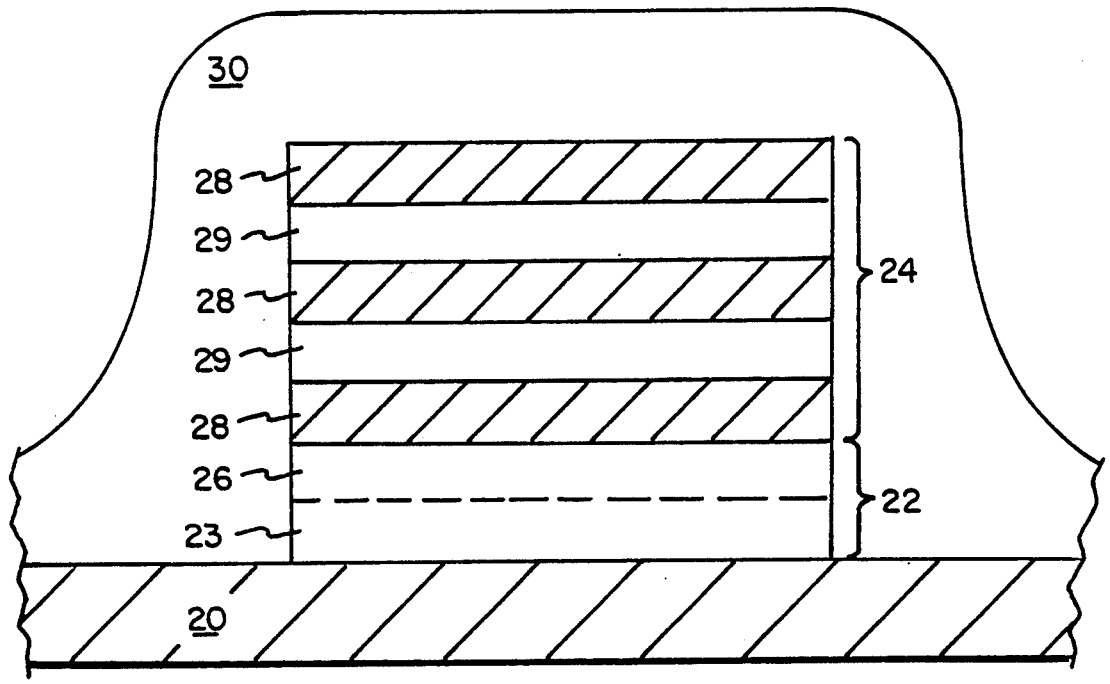
FIG. 2 is a cross sectional diagram of the waveguide of the present invention.

Referring now to FIG. 2 there is shown a cross section A—A of circular waveguide 12. This cross sectional diagram illustrates the construction of circular waveguide 12. Substrate 20 forms the base or bottom upon which all elements are attached. As previously mentioned, substrate 20 is generally made of a thermally stable material, such as Zerodur, silicon, silicon dioxide or gallium arsenide. Again, selection of the substrate will often depend upon the particular applications of the ring resonator.

Upon the substrate surface is deposited a first isolation layer 22. Generally first isolation layer 22 is constructed of a material having a fairly low index of refraction allowing for confinement of optical signals within the waveguide. In the preferred embodiment, first isolation layer includes two levels of material. A first level 23 may be grown upon substrate 20 or initially deposited in preparation of the substrates. A second level 26 may then be deposited when fabrication of the waveguide begins. Whatever the exact configuration, first isolation layer 22 provides the waveguide with the necessary containment so as to maintain any optical signals within the waveguide.

Upon first isolation layer 22 is deposited a multilayer stack or waveguide core 24 which makes up the waveguide of the present invention. Multilayer stack 24 is comprised of alternating layers of a first material 28 and a second material 29. A layer of first material 28 is deposited upon first isolation layer 22. First material 28 generally has a high index of refraction. A layer of second material 29 is then deposited upon layer of first material 28. Layer of second material 29 is generally constructed of a material having a lower index of refraction than that of the layer of first material 28. Second material 29 is a material having a low index of refraction similar to that of first isolation layer 22. Furthermore, second material 29 is a combination of a low index of refraction substance and a rare earth substance. First layer 28 and second layer 29 are then repeated a plurality of times to create multilayer stack 24. It is important that there be one more layer of first material 28 than of second material 29 so that second material 29 is always sandwiched between two layers of first material 28. In summary, first material has a relatively high index of refraction and second material has a relatively low index of refraction as well as being doped with a rare earth material.

Upon the top of and surrounding multilayer stack 24, is a second isolation layer 30. Second isolation layer 30 is constructed of similar material as that of first isolation layer 22, and also has a relatively low index of refraction.

The multilayer waveguide of the present invention provides a low loss light transmission medium. Furthermore, the multilayer waveguide displays unique mode structures and birefringence which provide very good discrimination characteristics against certain wavelengths and polarizations of light. Therefore, the waveguide of the present invention provides for a very good single mode operation.

In a preferred embodiment of the present invention substrate 20 is constructed of silicon dioxide ($SiO_2$). First containment layer 22 is constructed of silicon dioxide ($SiO_2$). Layer of first material 28 is constructed of Zirconium dioxide ($ZrO_2$) doped with ten percent (10%) of Silicon dioxide ($SiO_2$). Layer of second material 29 is Silicon dioxide ($SiO_2$) doped with erbium (Er). Lastly, second isolation layer 30 is also made up of silicon dioxide ($SiO_2$).

It will be understood by those skilled in the art that the number of layers of material within multilayer stack 24 could easily be altered to tailor the waveguide to particular applications and specifications. Furthermore, it would be understood that different materials could be used provided the relationships between the indices of refraction are appropriate. As an example of an alternate material which could be used, titanium dioxide (TiO$_2$) could be substituted in place of zirconium dioxide (ZrO$_2$). Furthermore, the entire waveguide could be doped with erbium as opposed to just the layers of second material 29. Lastly, just certain parts of the layers could be doped with the rare earth material.

Figure 4:
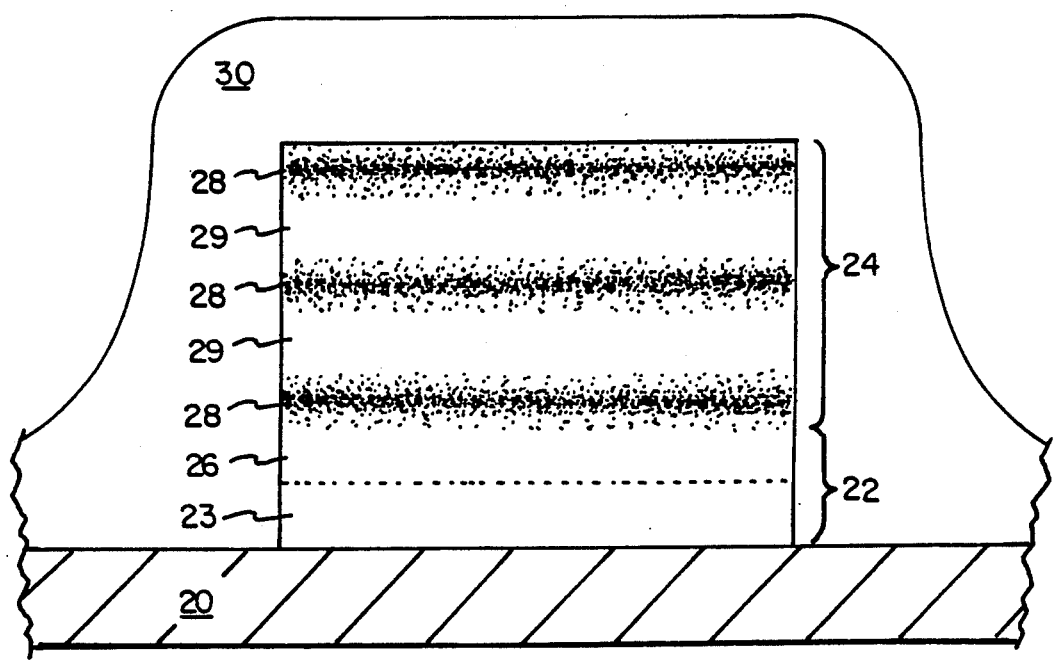
FIG. 4 is a cross sectional diagram illustrating an alternative embodiment of the waveguide of the present invention.

In the preferred embodiment, multilayer stack 24 is made up of a number of distinct layers (e.g. layer of first material 28, and layer of second material 29). In an alternate embodiment, the waveguide could be made up of a number of cycles or undefined transitions between materials. These cycles would take the form similar to that of the preferred embodiment, however, the transitions between first material 28 and second material 29 would not be sharply defined. Similarly, the transition between first isolation layer 22 and waveguide core 24 would not be sharply defined In this alternate embodiment, the transitions would be blended or graded, slowly changing from one material to another. An example of this alternative embodiment is shown in FIG. 4.

Construction of the waveguide of the present invention could be accomplished through numerous methods of manufacture, however the particular method used will affect the performance of the waveguide. In the preferred embodiment of the present invention all of the layers making up multilayer waveguide 24 are deposited upon each other by using the process of ion beam deposition. This method of thin film deposition is well known in the art. In summary, ion beam deposition is accomplished by bombarding a target material with a flow of ions causing particles of the target material to be dislodged from the target and consequently deposited upon surrounding surfaces. The advantages of using ion beam deposition include achieving uniformity, stoichiometry, high density, and purity of the thin film which is deposited. Further advantages are the ability to effectively blend differing materials, the ability to deposit materials without using excessive amounts of heat, and the adaptability of ion beam deposition to batch processing of parts. All of these characteristics of ion beam deposition provide the waveguide of the present invention with the quality needed as well as the low cost desired. Furthermore, the quality of thin films deposited by other methods have not displayed the same desirable qualities displayed by thin films deposited using ion beam deposition.

To further reduce the propagation loss of the waveguide, the waveguides are baked at a high temperature for a period of time. The time and temperature of this baking procedure will vary depending upon the materials used. While the multilayer waveguide has fairly low loss, this loss is not low enough to maintain a resonator appropriate for many applications. By doping some layers of material with a rare earth the necessary amplification required to maintain the resonator is achieved. This amplification is provided by pumping the resonator with a pump optical signal.

Ion beam deposition is particularly advantageous for the present invention due to the uniformity of the rare earth doping within the low index of refraction material. In the preferred embodiment silicon dioxide is doped with erbium. The use of ion beam deposition has produced a layer having very effective blending of the rare earth material and the low index of refraction material. In the resulting layer the rare earth material is very evenly distributed throughout that layer.

It would be understood by those skilled in the art that other methods of fabricating the multilayer waveguide of the present invention could be used. Other methods include chemical vapor deposition, magnetron sputtering, etc.

The rare earth doping of certain layers within the multilayer waveguide provides amplification to the waveguide. The energy distribution of the rare earth material is such that electrons are maintained at higher energy levels. Optical pumping induces electron transitions from a lower energy level to a higher energy level. Subsequently the passage of a second stimulating beam or optical signal causes the emission of a photon. This photon is then added to the light already resonating within the multilayer waveguide (the first optical signal), thus causing amplification.

In order to create amplification, i.e., pumping electrons into higher energy levels, the multilayer waveguide must be pumped with a second optical signal. The second optical signal must be at the appropriate wavelength to cause atoms of the rare earth material to be pumped to higher energy levels. In the preferred embodiment using a silicon dioxide layer doped with erbium, the first optical signal which resonates is at the wavelength of 1.53 micrometers. Amplification may be provided when the waveguide is pumped with a second optical signal having a wavelength of either 1.48 micrometers or 0.98 micrometers or other lower resonant wavelengths. These wavelength requirements will vary with each particular waveguide and with the rare earth material which is doped into the waveguide.

Figure 3:
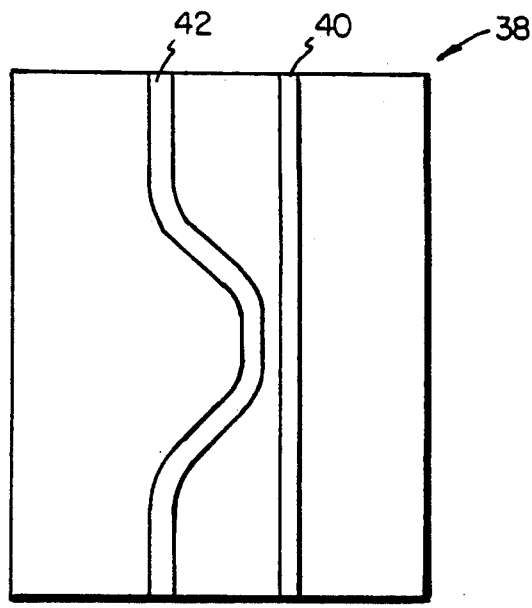
FIG. 3 is a top view of an amplifier embodying the principles of the present invention.

Referring now to FIG. 3 there is shown another application of the waveguide of the present invention. A waveguide 40 is manufactured in linear configuration. Waveguide 40 also has a cross section as shown in either FIG. 2 or FIG. 4. Adjacent to waveguide 40 is an amplification coupler 42. Amplification coupler 42 is used to carry light at an appropriate frequency and wavelength to cause amplification in waveguide 40. In this configuration, as in the configuration of FIG. 1, the waveguides would be multilayered using zirconium dioxide (ZrO$_2$) and dioxide (SiO$_2$) wherein portions of the silicon dioxide which are sandwich between zirconium dioxide layers are doped with erbium (Er).

Again, waveguide 40 carries a first optical signal which is being transmitted there through. A second optical signal is coupled into waveguide 40 by amplification coupler 42. The interaction between the second optical signal and the rare earth materials within waveguide 40 will cause amplification of the first optical signal. As with resonator 10, the necessary wavelengths of first optical signal and second optical signal can vary depending upon the application and configuration of waveguide 40.

In either embodiment of the present invention, the coupling of optical signals is necessary. Those skilled in the art will recognize that such coupling can be accomplished by a number of ways. Examples of other coupling methods include Y-splitters, and end pumps.

Having described the present invention in considerable detail it should be apparent to those skilled in the art that the invention can be modified in arrangement and detail with departing from the principles of the invention. We claim all modifications coming within the scope and spirit of the following claims.

What is claimed is:

1. A gain enhanced ring resonator for supporting resonating optical signals, comprising:

a substrate having a planar surface;

a waveguide means attached to the planar surface of the substrate for supporting a resonating optical signal, the waveguide means configured in a closed loop, the waveguide means comprised of a strip of blended first and second materials, the first material having a first index of refraction and the second material having a second index of refraction, the first and second materials blended such that the index of refraction varies in an oscillatory fashion between the first index of refraction and the second index of refraction as the waveguide is traversed in a direction normal to the substrate planar surface;

a first coupling means situated in close proximity to the waveguide means for coupling a first optical signal into the waveguide means to create the resonating optical signal; and a second coupling means situated in close proximity to the waveguide means for coupling a second optical signal into the waveguide means, the second optical signal for interacting with the materials of the waveguide means to cause amplification of the resonating optical signal.

2. The gain enhanced resonator of claim 1 wherein the second material is silicon dioxide ($SiO_2$) doped with erbium (Er).

3. The gain enhanced resonator of claim 1 wherein the first material is zirconium dioxide ($ZrO_2$) doped with silicon dioxide ($SiO_2$).

4. The gain enhanced resonator of claim 1 further comprising a first isolation layer situated between the substrate and the closed loop waveguide means, and a second isolation layer covering and surrounding the waveguide means, the first isolation layer and the second isolation layer made up of a material having an index of refraction lower than that of the first material.

5. The gain enhanced resonator of claim 4 wherein the first isolation layer and the second isolation layer are made up of silicon dioxide ($SiO_2$).

6. The gain enhanced resonator of claim 1 wherein the waveguide means is doped with a rare earth material.

7. The gain enhanced resonator of claim 6 wherein the rare earth material is Erbium.

* * * * *